(12) United States Patent
Lundy et al.

(10) Patent No.: US 11,823,902 B2
(45) Date of Patent: Nov. 21, 2023

(54) APPARATUS AND METHOD FOR SOLVENT VAPOUR ANNEALING OF A BLOCK COPOLYMER

(71) Applicant: Nokia Technologies Oy, Espoo (FI)

(72) Inventors: Ross Lundy, Dublin (IE); Ryan Enright, Dublin (IE)

(73) Assignee: Nokia Technologies Oy, Espoo (FI)

( * ) Notice: Subject to any disclaimer, the term of this patent is extended or adjusted under 35 U.S.C. 154(b) by 36 days.

(21) Appl. No.: 16/978,961

(22) PCT Filed: Mar. 19, 2019

(86) PCT No.: PCT/FI2019/050228
§ 371 (c)(1),
(2) Date: Sep. 8, 2020

(87) PCT Pub. No.: WO2019/180318
PCT Pub. Date: Sep. 26, 2019

(65) Prior Publication Data
US 2020/0411308 A1    Dec. 31, 2020

(30) Foreign Application Priority Data
Mar. 22, 2018  (EP) .................................... 18163283

(51) Int. Cl.
*H01L 21/027*        (2006.01)
*H01L 21/02*         (2006.01)
(Continued)

(52) U.S. Cl.
CPC .... *H01L 21/0271* (2013.01); *H01L 21/02118* (2013.01); *H01L 21/02282* (2013.01);
(Continued)

(58) Field of Classification Search
None
See application file for complete search history.

(56) References Cited

U.S. PATENT DOCUMENTS

| 6,188,050 B1 | 2/2001 | Duffer et al. |
| 8,945,408 B2 | 2/2015 | Chakrapani et al. |

(Continued)

FOREIGN PATENT DOCUMENTS

WO    WO-2004085712 A2 * 10/2004 ............. A61K 47/34

OTHER PUBLICATIONS

KR 101449850, Sik et al, Method for Solvent Annealing, Method for forming Block Copolymer Pattern Using the Same Block Copolymer Pattern formed by the Method for forming Block Copolymer Pattern Using the same, Oct. 13, 2014, pp. 1-11. (Year: 2014).*

(Continued)

*Primary Examiner* — Alexander G Ghyka
(74) *Attorney, Agent, or Firm* — Harrington & Smith

(57) ABSTRACT

An apparatus and method which may be used for fabricating nanoscale devices are disclosed. The apparatus comprises measurement means configured to measure swelling of a block copolymer during solvent vapour annealing of the block copolymer. The apparatus also comprises temperature control means configured to receive a control signal indicative of the swelling of the block copolymer. The temperature control means can then control the temperature of the block copolymer as indicated by the control signal.

20 Claims, 3 Drawing Sheets

Figure 1:
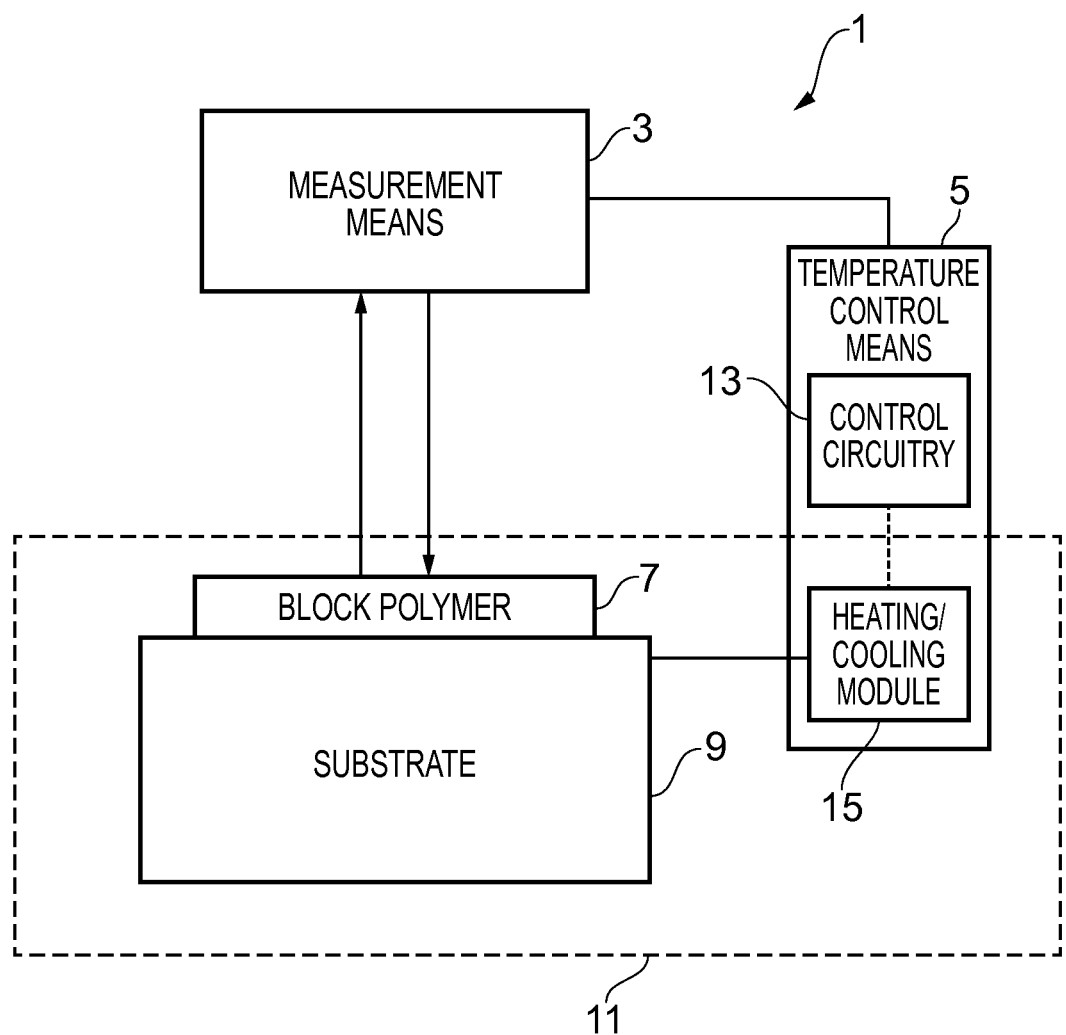

(51) Int. Cl.
    H01L 21/67          (2006.01)
    H01L 21/66          (2006.01)
(52) U.S. Cl.
    CPC .. H01L 21/02318 (2013.01); H01L 21/67248
                      (2013.01); H01L 22/26 (2013.01)

(56)                References Cited

U.S. PATENT DOCUMENTS 9,209,014 B2    12/2015  Rathsack
    2012/0202017 A1  8/2012  Nealey et al.
    2014/0196498 A1  7/2014  Xiao et al.
    2014/0273290 A1  9/2014  Somervell
    2014/0291878 A1 10/2014  Somervell
    2015/0239184 A1  8/2015  Chapuis et al.

OTHER PUBLICATIONS

Jin et al., "Nanopatterning via Solvent Vapor Annealing of Block Copolymer Thin Films", Chemistry of Materials, Sep. 9, 2016, pp. 1-53.

Kim et al., "Optimized Solvent Vapor Annealing for Long-range Perpendicular Lamellae in PS-b-PMMA Films", Macromolecules, vol. 49, No. 5, Feb. 12, 2016, 9 pages.

Extended European Search Report received for corresponding European Patent Application No. 18163283.7, dated Sep. 11, 2018, 9 pages.

Stenbock-Fermor et al., "Enhancing Ordering Dynamics in Solvent-Annealed Block Copolymer Films by Lithographic Hard Mask Supports", Macromolecules, vol. 47, No. 9, Apr. 21, 2014, pp. 3059-3067.

Lundy et al., "Nanoporous Membrane Production via Block Copolymer Lithography for High Heat Dissipation Systems", 15th IEEE Intersociety Conference on Thermal and Thermomechanical Phenomena in Electronic Systems (ITherm), 2016, 6 pages.

Lundy et al., "Controlled Solvent Vapor Annealing of a high [chi] Block Copolymer Thin Film", Physical Chemistry Chemical Physics, vol. 19, 2017, pp. 2805-2815.

International Search Report and Written Opinion received for corresponding Patent Cooperation Treaty Application No. PCT/FI2019/050228, dated May 2, 2019, 15 pages.

Tsarkova et al., "Nanopattern Evolution in Block Copolymer Films: Experiment, Simulations and Challenges", Advances in Polymer Science, Complex Macromolecular Systems, vol. 227, 2010, pp. 33-73.

* cited by examiner

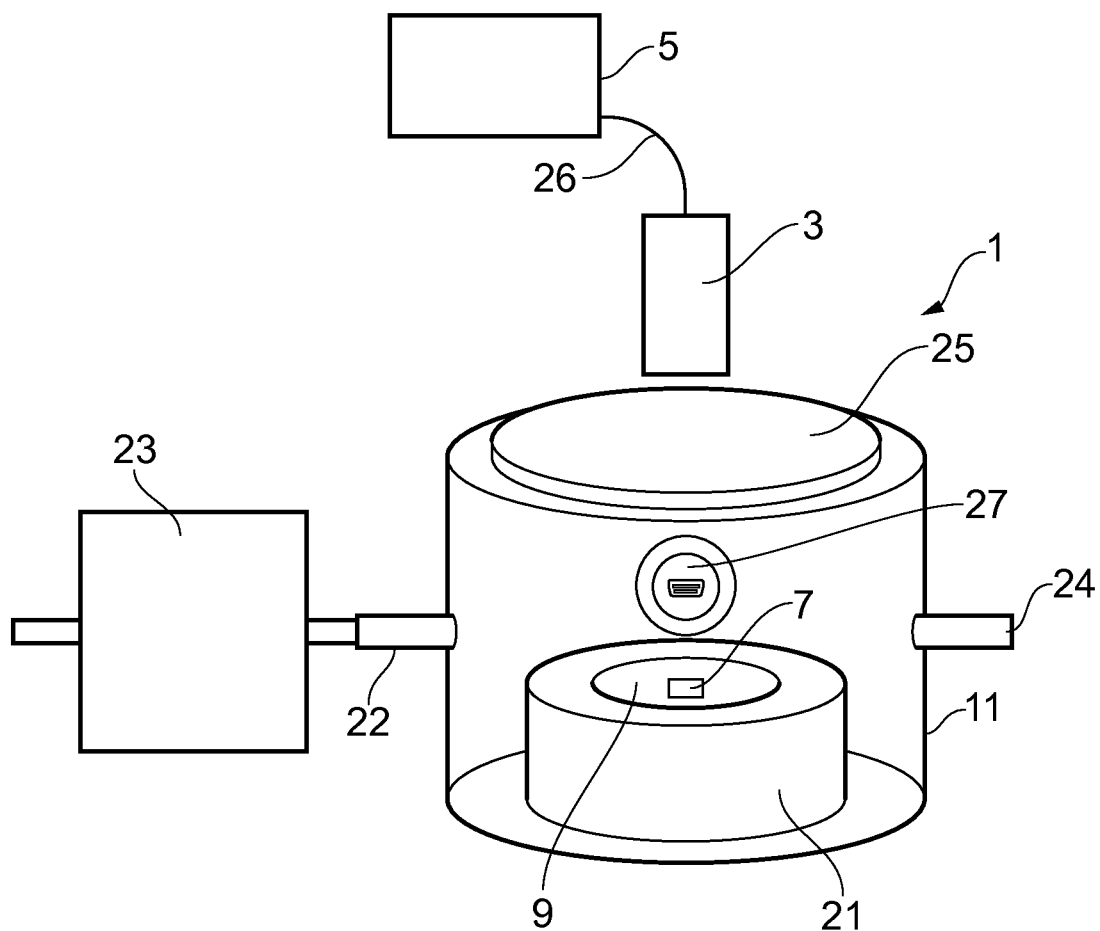
FIG. 2
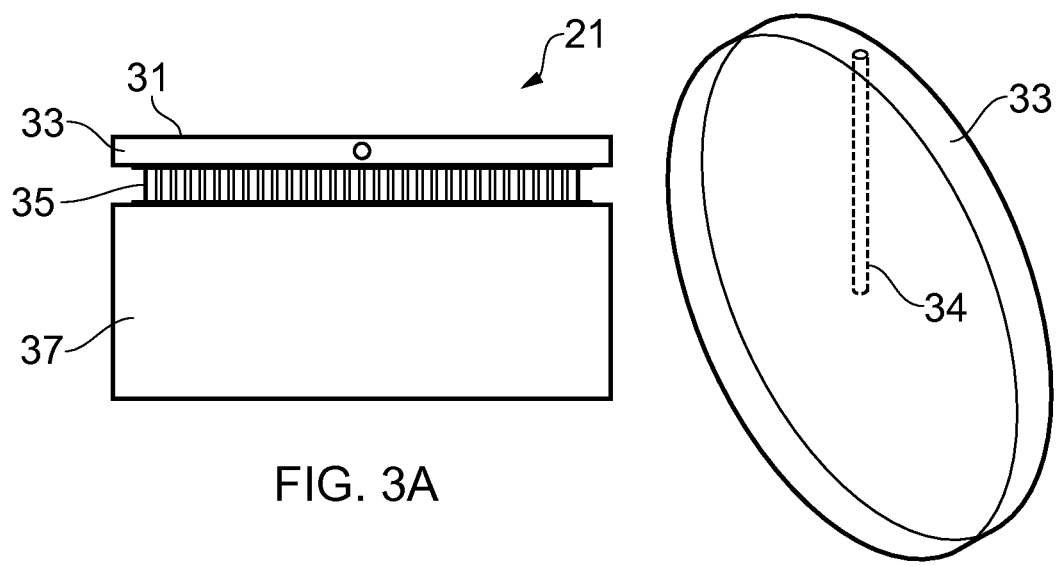
FIG. 3A
FIG. 3B

APPARATUS AND METHOD FOR SOLVENT VAPOUR ANNEALING OF A BLOCK COPOLYMER

RELATED APPLICATION

This application claims priority to PCT Application No. PCT/FI2019/050228, filed on Mar. 19, 2019, which claims priority to European Application No. 18163283.7, filed on Mar. 22, 2018, each of which is incorporated herein by reference in its entirety.

TECHNOLOGICAL FIELD

Examples of the disclosure relate to an apparatus and method for solvent vapour annealing of a block copolymer. In particular, they relate to an apparatus and method for pattern formation of a block copolymer using solvent vapour annealing.

BACKGROUND

Self-assembly of block copolymers can be used during the fabrication of nanoscale devices. The self-assembly enables patterns to be formed from the block copolymers. Once the pattern has been formed from the block copolymer this can then be used as a mask for the fabrication of a nanoscale device such as a nanoelectronic device.

The kinetics of the self-assembly of the block-copolymers are very sensitive to the level of swelling of the block copolymer. This must be taken into account to enable fast pattern formation and processing of the block copolymers.

BRIEF SUMMARY

According to various, but not necessarily all, examples of the disclosure there is provided an apparatus comprising: measurement means configured to measure swelling of a block copolymer during solvent vapour annealing of the block copolymer; temperature control means configured to receive a control signal indicative of the swelling of the block copolymer and control the temperature of the block copolymer as indicated by the control signal.

The temperature control means may comprise a thermoelectric cooling module.

The temperature control means may comprise control circuitry configured to receive the control signal indicative of the swelling of the block copolymer from the measurement means and control the thermoelectric cooling module in response to the control signal.

The apparatus may comprise a substrate configured to enable pattern formation of the block copolymer wherein the substrate is configured to enable the temperature control means to control the temperature of the substrate. The substrate may be configured to receive a plurality of wafers for pattern formation of the block copolymer.

The apparatus may comprise a chamber configured to enable solvent vapour annealing of the block copolymer. The apparatus may comprise injection means configured to inject a solvent directly into the chamber. The apparatus may comprise means for introducing turbulent flow of solvent within the chamber.

The measurement means may comprise optical measurement means. The optical measurement means may comprise at least one of a reflectometer, an ellipsometer.

The measurement means may be configured to measure the thickness of the polymer.

The block copolymer may have a high Flory Huggins parameter.

According to various, but not necessarily all, examples of the disclosure there is provided a method comprising: measuring swelling of a block copolymer during solvent vapour annealing of the block copolymer; and controlling the temperature of the block copolymer based upon the measured swelling of the block copolymer.

Controlling the temperature may comprise increasing or decreasing the temperature as required by the measured swelling.

The method may comprise providing the block copolymer on a substrate in a chamber to enable solvent vapour annealing of the block copolymer and injecting a solvent directly into the chamber.

The method may comprise using optical measurement means to measure the swelling of the block copolymer.

According to various, but not necessarily all, examples of the disclosure there is provided a nanoscale device formed by: measuring swelling of a block copolymer during solvent vapour annealing of the block copolymer; and controlling the temperature of the block copolymer based upon the measured swelling of the block copolymer.

According to various, but not necessarily all, examples of the disclosure there is provided an apparatus comprising: measurement circuitry configured to measure swelling of a block copolymer during solvent vapour annealing of the block copolymer; at least one temperature controller configured to receive a control signal indicative of the swelling of the block copolymer and control the temperature of the block copolymer as indicated by the control signal.

According to various, but not necessarily all, examples of the disclosure there are provided examples as claimed in the appended claims.

BRIEF DESCRIPTION

Figure 4:
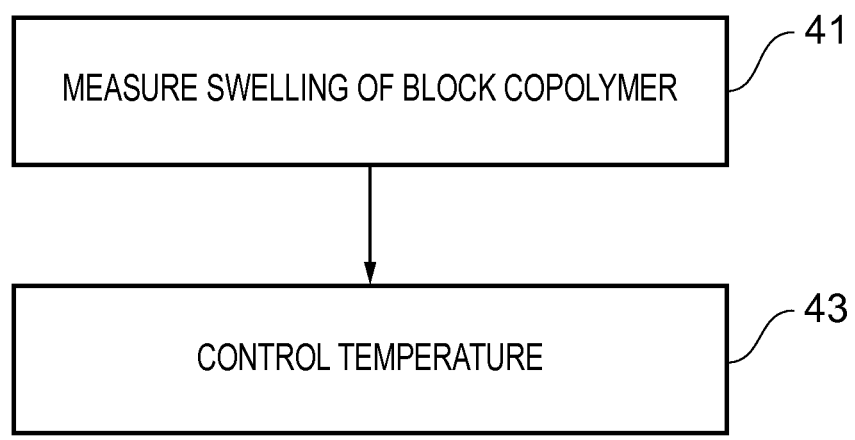

For a better understanding of various examples that are useful for understanding the detailed description, reference will now be made by way of example only to the accompanying drawings in which:

FIG. 1 illustrates an apparatus;
FIG. 2 illustrates another apparatus;
FIGS. 3A and 3B illustrate a pattern formation stage which may be used with examples of the disclosure; and
FIG. 4 illustrates an example method.

DETAILED DESCRIPTION

Examples of the disclosure relate to an apparatus and method for solvent vapour annealing of a block copolymer. In examples of the disclosure a measurement of the amount of the swelling of the block copolymer is used to determine the amount of solvent within the block copolymer. The swelling of the block copolymer can be determined from the thickness of the block copolymer. Initially the block copolymer will be provided as a thin film on a substrate. The block copolymer will then absorb the solvent during the solvent vapour annealing process.

In examples of the disclosure the information about the amount of swelling of the bloc copolymer can then be used to control the temperature of the block copolymer. This may control the amount of solvent within the block copolymer and other thermodynamic conditions to enable fast pattern formation. This may increase the efficiency of the pattern forming process and may reduce the time taken for the solvent vapour annealing process.

The pattern that is formed from the block copolymer can then be used as a mask for lithography to fabricate a nanoscale device.

FIG. 1 schematically illustrates an apparatus 1 according to examples of the disclosure. The apparatus 1 comprises measurement means 3 and temperature control means 5.

The apparatus 1 is configured to control the conditions for solvent vapour annealing of a block copolymer 7. The solvent vapour annealing may comprise annealing a block copolymer 7 by exposing the block copolymer 7 to a solvent vapour. The block copolymer may comprise any polymer which comprises blocks of different polymerized monomers.

The apparatus 1 may be configured to optimize the thermodynamic conditions for the pattern formation process using solvent vapour annealing. The block copolymer 7 may be provided on a substrate 9 configured to enable pattern formation of the block copolymer 7. The substrate 9 and the block copolymer 7 may be provided within a chamber 11 configured to enable solvent vapour annealing of the block copolymer 7. The chamber 11 may be configured to be sealed during the solvent vapour annealing process.

The thickness of the block copolymer 7 will be dependent upon the amount of solvent that has been absorbed by the block copolymer 7 during the solvent vapour annealing. The amount of solvent within the block copolymer 7 will determine the diffusivity of the block copolymer which will determine how easily the self-assembly and pattern formation of the block copolymer 7 can take place. This may determine the time taken for the patterns to be formed.

The measurement means 3 comprises any means which may be arranged to measure the swelling of the block copolymer 7. In some examples the measurement means 3 may be configured to measure the thickness of the block copolymer 7. The measurement means 3 may comprise measurement circuitry which may comprise one or more sensors or any other suitable means.

In some examples of the disclosure the measurement means 3 may comprise optical measurement means. The optical measurement means may measure the thickness of the block copolymer 7. In such examples the optical measurement means may comprise one or more light sources, such as light emitting diodes, and one or more photosensors arranged to detect light reflected from the block copolymer 7. In some examples the optical measurement means could comprise a reflectometer, an ellipsometer or any other suitable means.

In the example of FIG. 1 the measurement means 3 is configured so that, when the apparatus 1 is in use, a light signal from the measurement means 3 is incident on the block copolymer 7 and reflected back to the measurement means 3 to enable the thickness of the block copolymer 7 to be determined.

In some examples the measurement means 3 may be arranged to measure the rate of change of swelling of the block copolymer 7. In such examples the measurement means 3 may be arranged to make measurements of the swelling of the block copolymer 7 at different points in time. This may give an indication of the rate at which the solvent is being absorbed by the block copolymer 7.

In the example of FIG. 1 the measurement means 3 is provided outside of the chamber 11. In such examples the chamber 11 comprises a portion which is transparent, or at least partially transparent, to the wavelengths of light detected by the measurement means 3. In other examples the measurement means 3 could be provided within, or at least partially within the chamber 11. For example a light source and/or optical sensor could be provided within the chamber 11.

The measurement means 3 is coupled to the temperature control means 5 so that an output signal from the measurement means 3 is provided to the temperature control means 5. This enables information indicative of the swelling of the block copolymer 7 and the amount of solvent within the block copolymer 7 to be provided to the temperature control means 5.

The temperature control means 5 may comprise any means which can be configured to control the temperature of the block copolymer 7 and/or the solvent within the chamber.

In some examples of the disclosure the temperature control means 5 may comprise control circuitry 13. The control circuitry 13 may be configured to receive a control signal indicative of the swelling of the block copolymer 7 from the measurement means 3. The control circuitry 13 may be configured to determine whether or not the temperature of the block copolymer 7 needs to be increased or decreased based on the measurements of the swelling of the block copolymer 7. The control circuitry 13 may be configured to maintain conditions within the chamber 11 which will enable easy self-assembly and pattern formation of the block copolymer 7. The control circuitry 13 may be configured to maintain conditions within the chamber 11 which will enable self-assembly and pattern formation of the block copolymer 7 within a predetermined time. The predetermined time could be less than ten minutes. In some examples the predetermined time could be less than five minutes. In some examples the predetermined time could be around 1 minute.

In some examples the control circuitry 13 may be configured to maintain optimal, or substantially optimal, conditions within the chamber 11 for self-assembly and pattern formation of the block copolymer 7.

The control circuitry 13 may be configured to control the temperature of the block copolymer 7 to reduce dewetting of the block copolymer 7 during the pattern formation. The dewetting could occur due to bulk solvent condensation during the solvent vapour annealing process. This dewetting may be undesirable as it may decrease the plasticity of the block copolymer and increase the pattern formation time. The amount of dewetting can be determined by the thickness of the block copolymer 7 as this gives a measure of the amount of solvent within the block copolymer 7. The temperature control means 5 may therefore decrease the pattern formation times by controlling the temperature to reduce the dewetting.

In some examples the control circuitry 13 may comprise a proportional integral derivative (PID) controller or any other suitable type of control circuitry 13. The control circuitry may be configured to determine the difference between the desired swelling of the block copolymer 7 and the measured swelling of the block copolymer 7 and provide a control signal to control the temperature of the block copolymer 7 to bring the swelling of the block copolymer 7 to the desired swelling.

The temperature control means 5 may also comprise a module 15 configured to heat and/or cool the block copolymer 7 within the chamber 11. In some examples the same module 15 can be used for both heating and cooling the block copolymer 7. In other examples different modules could be used for heating and cooling the block copolymer 7. The module 15 may be coupled to the substrate 9 so that changes in the temperature of the module 15 will change the temperature of the substrate 9 and the block copolymer 7 on the substrate 9. This enables the temperature control means 5 to control the temperature of the substrate 9.

In some examples of the disclosure the module 15 configured to heat and/or cool the block copolymer 7 comprises a thermoelectric cooling module. The thermoelectric cooling module may comprise any means which uses the thermoelectric effect to cause a reduction in temperature. The temperature of the thermoelectric cooling module may be controlled by controlling the voltage applied across the module. The thermoelectric module could be configured to both cool and heat the block copolymer 7 as required.

The module 15 configured to heat and/or cool the block copolymer 7 may be coupled to the control circuitry 13 so that an output signal from the control signal is used to control the module 15 configured to heat and/or cool the block copolymer 7. For example an output from the control circuitry 13 may be used to control the voltage across a thermoelectric cooling module.

In some examples of the disclosure some components of the temperature control means 5 may be provided within the chamber 11 while other components of the temperature control means 5 may be provided outside of the chamber 11. For example, the control circuitry 13 may be provided outside of the chamber 11 while the module 15 configured to heat and/or cool the block copolymer 7 could be provided inside of the chamber 11.

It is to be appreciated that other arrangements of the apparatus 1 could be used in other examples of the disclosure. For instance, in some examples the control circuitry 13 configured to determine whether or not the temperature of the block copolymer 7 needs to be increased or decreased could be integrated within the measurement means 5.

As the measurement means 3 measures the swelling of the block copolymer 7 this provides an instantaneous indication of the amount of solvent that has been absorbed by the block copolymer 7. This can then be used to determine whether the temperature of the block copolymer 7 should be increased or decreased in order to provide kinetic conditions which a more favourable to self-assembly. The measurement of the swelling, for example by measuring the thickness, may provide for a faster measurement which enables for more accurate and responsive temperature control which may increase the rate of self-assembly and pattern formation.

FIG. 2 schematically illustrates another apparatus 1 according to examples of the disclosure. The apparatus 1 comprises measurement means 3 and temperature control means 5 which may be as described above. In the example of FIG. 2 the apparatus 1 also comprises injection means 23 which are configured to inject a solvent directly into the chamber 11.

In the example of FIG. 2 the block copolymer 7 may be provided on a substrate 9 configured to enable pattern formation of the block copolymer 7. The substrate 9 could be a silicon wafer or any other suitable type of substrate 9.

The substrate 9 may be provided on a pattern formation stage 21. The pattern formation stage 21 may be coupled to a module 15 configured to heat and/or cool the block copolymer to enable the temperature of the substrate 9 and the block copolymer 7 on the substrate 9 to be controlled. Examples of a pattern formation stage 21 are shown in more detail in FIGS. 3A and 3B.

The substrate 9 and the block copolymer 7 are provided within a chamber 11 configured to enable solvent vapour annealing of the block copolymer 7. The chamber 11 is arranged to receive the solvent for the solvent vapour annealing process. In the example of FIG. 2 the chamber 11 comprises an inlet 22 and an outlet 24. The inlet 22 enables solvent to be provided into the chamber 11. The outlet 24 enables the solvent to be removed from the chamber 11 after the solvent vapour annealing and pattern formation has been completed. The inlet 22 and the outlet 24 could also be used for flushing the chamber 11 with inert gases before and after the block solvent vapour annealing process.

In the example of FIG. 2 the inlet 22 is coupled to the injection means 23. The injection means 23 may comprise any means which may be configured to inject the solvent directly into the chamber 11. The injection means 23 may be arranged to inject a fixed mass of solvent directly into the sealed chamber 11 so as to achieve a defined solvent partial pressure within the chamber 11. The defined solvent partial pressure may be selected so as to optimize, or substantially optimize, solvent absorption by the block copolymer 7 within the sealed chamber 11. The defined solvent partial pressure may be selected so as to establish thermodynamic conditions which enable fast pattern forming by the block copolymer 7. The fast pattern forming could be less than one minute.

The injection means 23 is configured to force the solvent into the chamber 11 such that the addition of the solvent causes turbulent flow of the solvent within the chamber 11. The turbulent flow of the solvent may comprise random movement of the solvent. The turbulent flow of the solvent may comprise flow that is not laminar. The injection means 23 may be configured to force the solvent into the chamber such that the addition of the solvent causes turbulent flow of the solvent close to the block copolymer 7 so as to reduce boundary layer effects at the surface of the block copolymer 7. The boundary layer effects may reduce the rate at which a solvent can be absorbed by the block copolymer 7. Therefore reducing the boundary layer effects may increase the rate at which the solvent is absorbed by the block copolymer 7 which may reduce the time needed for the solvent vapour annealing process.

In some examples the injecting of the solvent into the chamber 11 may cause a rapid increase in the pressure within the chamber 11. This may help to increase the rate of absorbance of the solvent by the block copolymer 7.

In the example of FIG. 2 the measurement means 3 comprises an optical measurement means such as reflectometer, ellipsometer or any other suitable means.

In the example of FIG. 2 the measurement means 3 is provided outside of the chamber 11. The chamber 11 comprises a transparent portion 25 which is transparent to the wavelengths of light that are detected by the measurement means 3. In the example of FIG. 2 the transparent portion 25 is provided in an upper surface of the chamber 11 and the measurement means 3 is positioned over the transparent portion 25. In other examples the transparent portion 25 and the measurement means 3 could be provided in other positions. One or more optical elements may be used to deflect and reflect the light as needed.

The measurement means 3 are configured to provide an output signal to the temperature control means 5. The output signal provides an indication of the swelling of the block copolymer 7. The temperature control means 5 uses this information to control the temperature of the module 15 configured to heat and/or cool the block copolymer. The module 15 configured to heat and/or cool the block copolymer may be provided within the pattern formation stage 21. An example of a pattern formation stage 21 is shown in more detail in FIGS. 3A and 3B.

In the example of FIG. 2 one or more other sensors 27 are also provided within the chamber 11. The one or more other sensors 27 may be used to sense parameters within the chamber. This may provide information to the temperature control means 5 and/or the injection means 23. For example the one or more sensors 27 could be configured to detect the temperature and/or pressure of the solvent within the chamber 11. This information could then be used to control the heating and/or cooling module and/or to control the injection means 23.

In the example of FIG. 2 the injection means 23 are used to introduce turbulent flow within the solvent in the chamber 11. It is to be appreciated that other means configured to introduce turbulent flow could be used in other examples of the disclosure. For example a mixing mechanism could be provided within the chamber 11 which could be configured to mix or stir the solvent as needed.

FIGS. 3A and 3B illustrate a pattern formation stage 21 that may be used in some examples of the disclosure. FIG. 3A shows a cross section through the pattern formation stage 21 and FIG. 3B shows a heating module 33 which may be provided within the pattern formation stage 21. The pattern formation stage 21 may be provided within a chamber 11 as shown in FIG. 2.

The pattern formation stage 21 comprises an upper surface 31. A wafer or other substrate 9 comprising a film of block copolymer 7 may be positioned on the upper surface of the pattern formation stage 21 to enable solvent vapour annealing and pattern formation of the block copolymer 7. The upper surface 31 of the pattern formation stage 21 may be large enough to receive a plurality of wafers or other types of substrates. In some examples the upper surface 31 could have a diameter of up to 500 mm. This may enable the solvent vapour annealing and pattern forming process to be performed for multiple wafers, or other types of substrate 9 simultaneously.

In the example of FIG. 3A the pattern formation stage 21 comprises a heating module 33 and a cooling module 35. In the example of FIG. 3A the heating module 33 and the cooling module 35 may be separate modules. In other examples they may be provided within a single module 15 configured to heat and/or cool the block copolymer. The heating module 33 and the cooling module 35 may form part of the temperature control means 5.

The heating module 33 may comprise any means which may be arranged to increase in temperature in response to a control signal. The heating module 33 could comprise a pyroelectric material or any other suitable means.

In the example of FIG. 3A the heating module 33 provides the upper surface 31 of the pattern formation stage 21. The heating module 33 may be in direct contact with the substrate 9 when the substrate 9 is positioned on the pattern formation stage 21.

A sensor 34 may be provided within the heating module 33. The sensor 34 may detect the temperature of the heating module 33. The temperature information may be provided to the temperature control means 5. The temperature information obtained by the sensor 34 may be used in addition to measurements obtained from the measurement means 3 to control the temperature of the block copolymer 7.

The heating module 33 may be coupled to the control circuitry of the temperature control means 5 to enable the data obtained by the sensor 34 to be provided to the control circuitry 13 and/or to enable the heating module 33 to be controlled by the control circuitry 13.

The cooling module 35 may comprise any means which may be arranged to decrease in response to a control signal. The cooling module 35 could comprise a thermoelectric cooler or any other suitable means.

In the example of FIG. 3A the cooling module 35 is provided underneath the heating module 33. The heating module 33 is positioned between the substrate 9 and the cooling module 35 when the substrate 9 is positioned on the pattern formation stage 21.

The cooling module 35 may be coupled to the control circuitry 13 of the temperature control means 5 to enable the cooling module 35 be controlled by the control circuitry 13.

In the example of FIG. 3A the pattern formation stage 21 also comprises a heat sink 37. The heat sink is provided underneath the cooling module 35. The heat sink 37 may be coupled to the cooling module 35 so that the heat sink 37 is in thermal contact with the cooling module 35. The heat sink 37 may facilitate the cooling of the substrate 9 and the block copolymer 7 on the substrate 9.

The heating module 33 and the cooling module 35 may be configured to provide different functions during different stages of the solvent vapour annealing and pattern formation process. During swelling of the block copolymer 7 the heating module 33 and the cooling module 35 may be used to control the rate of swelling. For example, they may be used to reduce the temperature or increase the temperature as needed. During the solvent vapour annealing and pattern formation process the heating module 33 and the cooling module 35 enables stable conditions to be provided. This can ensure that the narrow range of thermodynamic conditions that enable fast pattern forming can be provided. Once the block copolymer 7 has formed into the pattern the cooling module 35 may be used to bring the block copolymer 7 back to room temperature.

FIG. 4 illustrates an example method which may be implemented using apparatus 1 as described above and shown in FIGS. 1 to 3B.

At block 41 the method comprises measuring swelling of a block copolymer 7 during pattern formation of the block copolymer 7. The swelling could be measured using optical measurement means, or any other suitable type of measurement means 3 as described.

In examples of the disclosure the block copolymer 7 that is used may be a polymer with a high Flory Huggins parameter. The Flory Huggins parameter may be considered to be high if the block copolymer 7 has diffusivity such that solvent vapour annealing is used for the pattern formation process rather than thermal annealing. The high Flory Huggins parameter could be above 0.1. The polymer that is used could be PS-b-P4VP (polystyrene-block-poly(4-vinylpyridine)), PS-b-PDMS (polystyrene-block-polydimethylsiloxane), PS-b-P2VP (polystyrene-block-poly(2-vinylpyridine)), or any other suitable polymer.

The polymer having a high Flory Huggins parameter may enable a pattern having very small dimensions to be formed. In some examples the dimensions of the pattern could be less than 10 nm. In some examples the dimensions of the pattern could be as small as 5 nm.

At block 43 the method comprises controlling the temperature of the block copolymer 7 based upon the measured swelling of the block copolymer 7. The temperature may be controlled by the temperature controlling means 5. The temperature controlling means 5 may be configured to receive information indicative of the swelling of the block copolymer 7 and use this information to control the heating module 33 and/or the cooling module 35 of the pattern formation stage.

The temperature controlling means 5 is arranged to control the temperature of the block copolymer 7 to maintain the swelling of the block copolymer within a range within enables fast pattern forming. The range may be very small and so the use of the measurement means 3 to provide accurate and fast measurements of the swelling of the block copolymer 7 ensures that this level of swelling is maintained.

Once the solvent vapour annealing process has been completed the pattern that is formed from the block copolymer 7 can then be used as a mask for lithography to fabricate a nanoscale device. The nanoscale device could be any suitable type of nanoscale device. In some examples the nanoscale device could be a nanoporous membrane which may be configured to cool a semiconductor chip.

Once the pattern has been formed from the block copolymer 7 the chamber 11 could be rapidly flushed with an inert gas. The patterned block copolymer 7 can then be removed from the chamber 11 so that the patterned block copolymer 7 can be used to fabricate a nanoscale device.

Examples of the disclosure may enable nanoscale devices having very small structures to be fabricated. The size of the structures could be less than 10 nm. In some examples the size of the structures could be less than 5 nm. The apparatus 1 could be used to form nanoscale devices such as nanoporous membranes for cooling systems, waveguides or any other suitable type of devices.

Examples of the disclosure provide the advantage that fast and accurate measurements about the conditions within the chamber 11 and the swelling of the block copolymer 7 can be obtained using the measurement means 3. The measurement of the swelling of the block copolymer 7 may be faster and more accurate than the measurement of the temperature of the block copolymer 7 or other parts of the system because there is no requirement for thermal equilibrium to be established. This may provide for a more responsive temperature control system which can enable the optimal, or substantially optimal, conditions for pattern formation during solvent vapour annealing to be maintained. This may reduce or minimize the amount of dead time in the solvent vapour annealing process and so reduce the fabrication time for the nanoscale devices.

The use of the temperature control means 5 may enable the temperature of the block copolymer 7 to be controlled without the use of a liquid cooling/heating system. This may provide for more accurate temperature control. This may also remove the need for a separate cooling unit to be used. This may reduce the cost and complexity of the process as well as making the process faster.

Also as the temperature control means 5 uses information from the measurement means 3 this provides for an automatic control system. There is no need for any manual control or intervention during the pattern formation process.

Also the use of the heating module 33 and the cooling module 35 used in examples such as the example of FIG. 2 can reduce the time it takes to process multiple samples. For example, once one sample of block copolymer 7 has been removed the chamber 11 the pattern formation stage 21 can be immediately cooled down to the required temperature for the next sample of block copolymer 7.

In this description the term coupled means operationally coupled. Any number of components can be provided between coupled entities, including zero components.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   an optical meter configured to measure a rate of swelling of a block copolymer during solvent vapour annealing of the block copolymer; and
   a temperature controller configured to receive a proportional integral derivative control signal indicative of the swelling of the block copolymer and to vary the temperature of the block copolymer as indicated by the control signal to reduce dewetting of the block copolymer to control the rate of the swelling of the block copolymer.

2. An apparatus as claimed in claim 1 wherein the temperature controller comprises a thermoelectric cooler.

3. An apparatus as claimed in claim 2 wherein the temperature controller comprises control circuitry configured to receive the control signal indicative of the swelling of the block copolymer from the optical meter and control the thermoelectric cooler in response to the control signal.

4. An apparatus as claimed in claim 1 comprising a substrate configured to enable pattern formation of the block copolymer wherein the substrate is configured to enable the temperature controller to control the temperature of the substrate.

5. An apparatus a claimed in claim 4 wherein the substrate is configured to receive a plurality of wafers for pattern formation of the block copolymer.

6. An apparatus as claimed in claim 1 comprising a chamber configured to enable solvent vapour annealing of the block copolymer.

7. An apparatus as claimed in claim 6 comprising injector configured to inject a solvent directly into the chamber, wherein the injector is arranged to inject a fixed mass of solvent directly into the chamber so as to achieve a defined solvent partial pressure within the chamber.

8. An apparatus as claimed in claim 6 comprising inlet configured to introduce turbulent flow of solvent within the chamber.

9. An apparatus as claimed in claim 1 wherein the optical meter comprises at least one of a reflectometer or an ellipsometer.

10. An apparatus as claimed in claim 9 wherein the optical meter is configured to measure the thickness of the polymer.

11. An apparatus as claimed in claim 1 wherein the block copolymer has a high Flory Huggins parameter.

12. A method comprising:
measuring a rate of swelling of a block copolymer during solvent vapour annealing of the block copolymer; and
varying the temperature of the block copolymer using a proportional integral derivative control signal to reduce dewetting of the block copolymer based upon the measured rate of swelling of the block copolymer to control the rate of the swelling of the block copolymer.

13. A method as claimed in claim 12 wherein varying the temperature comprises increasing or decreasing the temperature in response to the measured swelling.

14. A method as claimed in claim 12 comprising providing the block copolymer on a substrate in a chamber to enable solvent vapour annealing of the block copolymer and injecting a solvent directly into the chamber.

15. A method as claimed in claim 12 wherein the varying the temperature comprises thermoelectric cooling.

16. A method as claimed in claim 12 comprising patterning the block copolymer.

17. A method as claimed in claim 16 comprising using a substrate to receive a plurality of wafers for patterning.

18. A method as claimed in claim 12 comprising vapour annealing of the block copolymer.

19. A method as claimed in claim 18 comprising introducing turbulent flow of solvent.

20. A method as claimed in claim 12 wherein the varying of the temperature comprises using a reflectometer.

\* \* \* \* \*